US009431551B2

(12) United States Patent
Wilhelm

(10) Patent No.: US 9,431,551 B2
(45) Date of Patent: Aug. 30, 2016

(54) CIRCUIT ARRANGEMENT AND METHOD OF FORMING A CIRCUIT ARRANGEMENT

(71) Applicant: Infineon Technologies AG, Neubiberg (DE)

(72) Inventor: Detlef Wilhelm, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/485,824

(22) Filed: Sep. 15, 2014

(65) Prior Publication Data

US 2016/0079445 A1    Mar. 17, 2016

(51) Int. Cl.

| | |
|---|---|
| H01L 27/148 | (2006.01) |
| H01L 31/0232 | (2014.01) |
| H01L 21/02 | (2006.01) |
| H01L 21/20 | (2006.01) |
| H01L 29/94 | (2006.01) |
| H01L 27/06 | (2006.01) |
| H01L 29/66 | (2006.01) |
| H01L 21/265 | (2006.01) |
| H01L 21/3205 | (2006.01) |
| H01L 21/8234 | (2006.01) |

(52) U.S. Cl.
CPC ......... *H01L 29/94* (2013.01); *H01L 21/02107* (2013.01); *H01L 21/265* (2013.01); *H01L 21/32051* (2013.01); *H01L 21/823475* (2013.01); *H01L 27/0629* (2013.01); *H01L 29/66181* (2013.01)

(58) Field of Classification Search
CPC ... H01L 27/016; H01L 28/60; H01L 29/945; H01L 29/24; H01L 29/66181; H01L 21/02107; H01L 21/265; H01L 21/32051; H01L 21/823475; H01L 21/0629; H01L 27/0629

USPC ....... 257/229, 532, 238, 386, 397, 432, 774; 438/386, 60

See application file for complete search history.

(56) References Cited

U.S. PATENT DOCUMENTS

| | | | | |
|---|---|---|---|---|
| 5,888,866 | A | * | 3/1999 | Chien ........................... 438/254 |
| 5,952,687 | A | * | 9/1999 | Kawakubo et al. .......... 257/296 |
| 6,008,520 | A | * | 12/1999 | Darwish et al. .............. 257/330 |
| 6,027,761 | A | * | 2/2000 | King ............................... 427/79 |
| 6,162,670 | A | * | 12/2000 | Wu et al. ....................... 438/238 |
| 2003/0203512 | A1 | * | 10/2003 | Kweon ............................ 438/3 |
| 2007/0020850 | A1 | * | 1/2007 | Takaishi ........................ 438/259 |
| 2009/0101957 | A1 | * | 4/2009 | Cheng ........................... 257/301 |
| 2012/0146138 | A1 | * | 6/2012 | Lin ............................... 257/334 |

\* cited by examiner

*Primary Examiner* — Long K Tran
*Assistant Examiner* — Dzung Tran

(57) ABSTRACT

A circuit arrangement may be provided. The circuit arrangement may include a semiconductor substrate including a first surface, a second surface opposite the first surface, and a first doped region of a first conductivity type extending from the first surface into the semiconductor substrate. The circuit arrangement may include at least one capacitor including a first electrode including a doped region of the first conductivity type extending from the second surface into the semiconductor substrate, a dielectric layer formed over the first electrode extending from the second surface away from the semiconductor substrate, and a second electrode formed over the dielectric layer opposite the first electrode. The circuit arrangement may further include at least one semiconductor device monolithically integrated in the semiconductor substrate. The first doped region of the first conductivity type may extend from the first surface into the semiconductor substrate to form an electrically conductive connection with the first electrode.

7 Claims, 4 Drawing Sheets

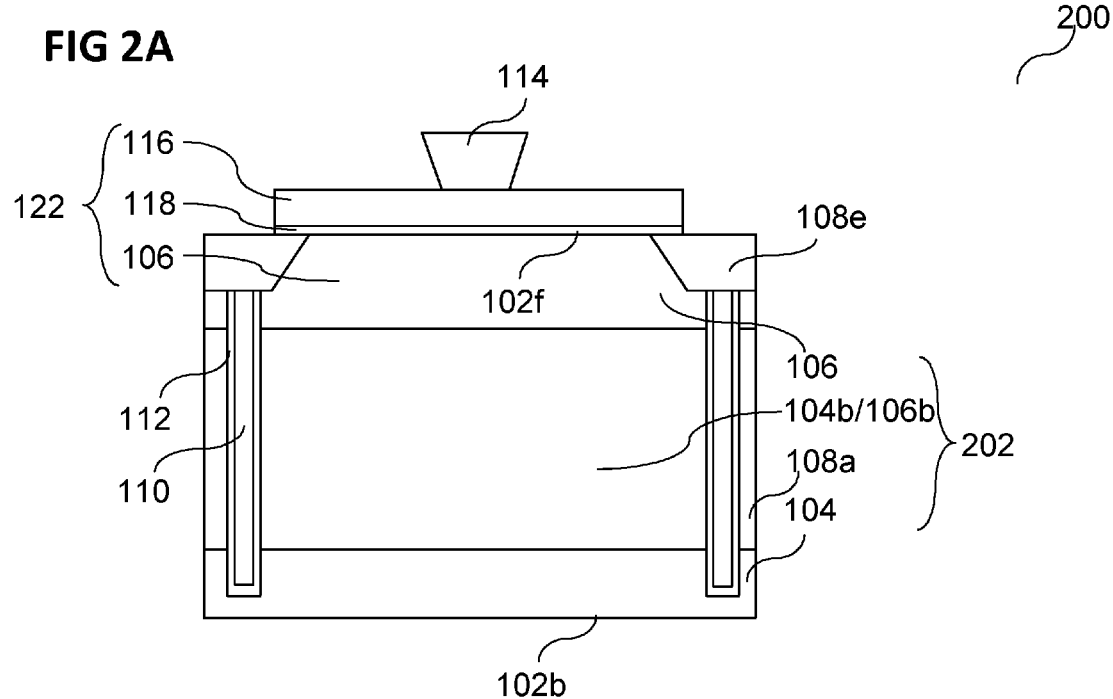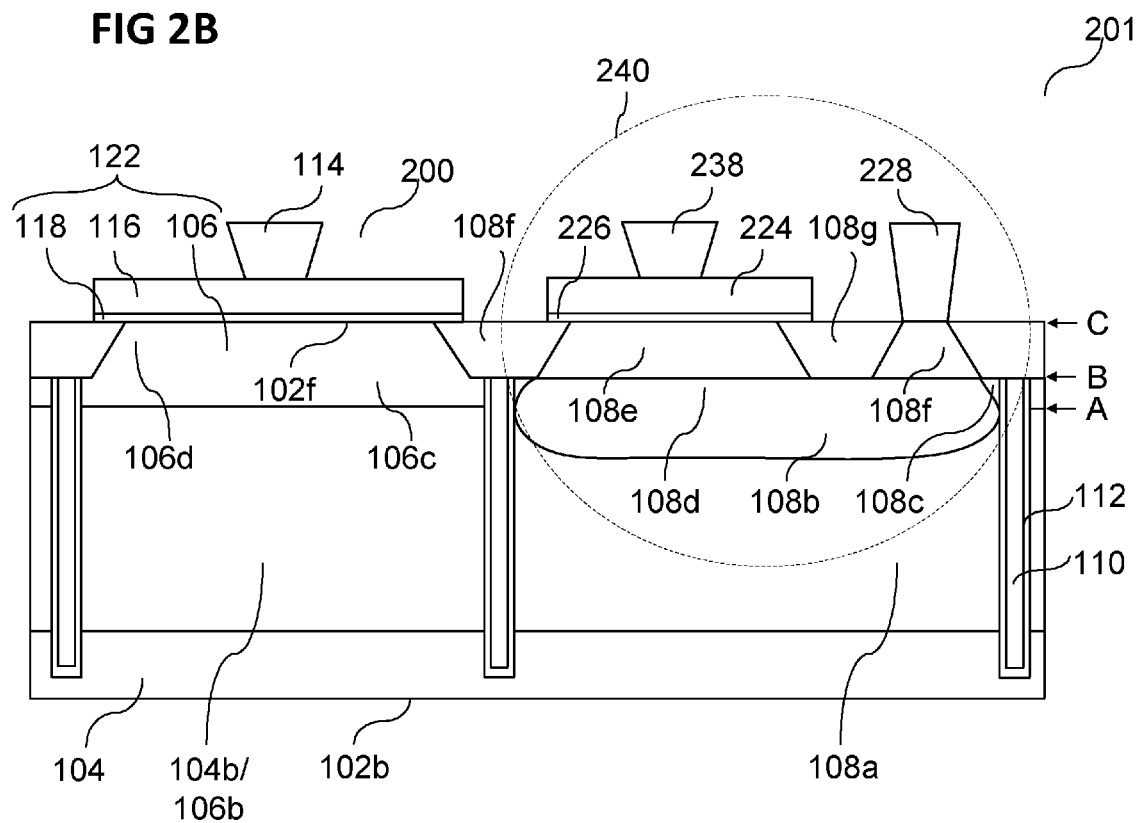

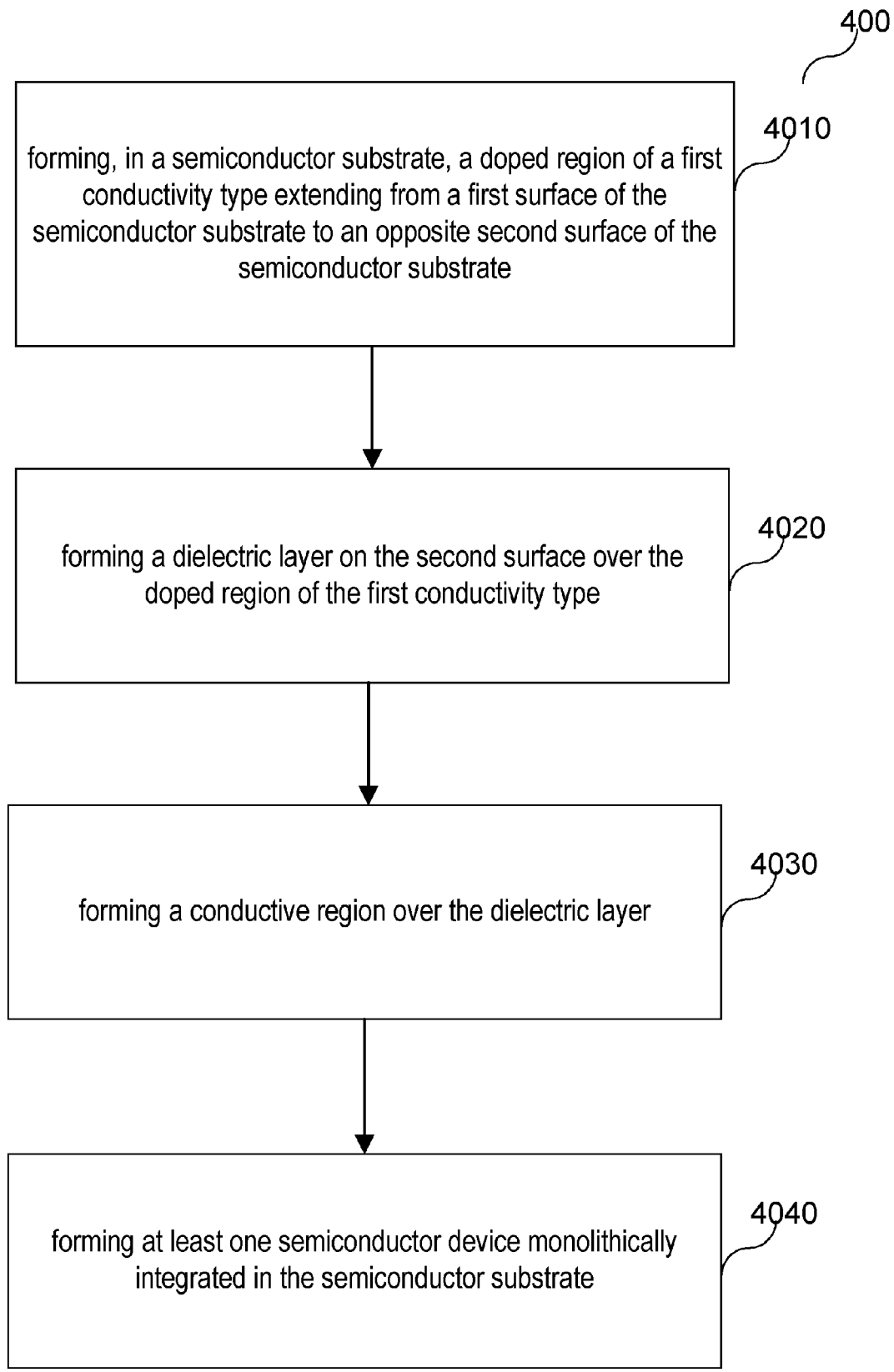

CIRCUIT ARRANGEMENT AND METHOD OF FORMING A CIRCUIT ARRANGEMENT

TECHNICAL FIELD

Various embodiments relate generally to a circuit arrangement and to a method of forming a circuit arrangement.

BACKGROUND

In a circuit arrangement, e.g. an integrated circuit (IC) formed in a semiconductor substrate, e.g. in an n-doped substrate, a capacitor, e.g. a blocking capacitor, may be integrated, e.g. a capacitor for blocking a high frequency (HF) signal, e.g. a metal-insulator-semiconductor capacitor (MISCAP, wherein "metal" may not strictly be a metal, but any conductive material, e.g. a doped semiconductor, e.g. a degenerate semiconductor). The capacitor, e.g. blocking capacitor, may be formed with its electrodes essentially parallel to a main surface of the semiconductor substrate. A top electrode of the capacitor may thus be accessible, but a bottom electrode may be buried underneath the top electrode, and a separate contact for connecting the bottom electrode may need to be formed. Furthermore, the separate contact may need to be electrically connected to ground. Typically, this may have been achieved by means of a doped region that may be arranged laterally next to the top electrode of the capacitor. The doped region may be electrically connected with the bottom electrode. The doped region may furthermore be electrically connected to ground, for example externally connected, e.g. across a surface of the semiconductor. Such a contacting scheme for the bottom electrode may cause serial resistances and serial inductivities, which may be disadvantageous in a blocking capacitor.

SUMMARY

In various embodiments, a circuit arrangement may be provided. The circuit arrangement may include a semiconductor substrate including a first surface, a second surface opposite the first surface, and a first doped region of a first conductivity type extending from the first surface into the semiconductor substrate. The circuit arrangement may further include at least one capacitor including a first electrode including a doped region of the first conductivity type extending from the second surface into the semiconductor substrate, a dielectric layer formed over the first electrode extending from the second surface away from the semiconductor substrate, and a second electrode formed over the dielectric layer opposite the first electrode. The circuit arrangement may further include at least one semiconductor device monolithically integrated in the semiconductor substrate. The first doped region of the first conductivity type may extend from the first surface into the semiconductor substrate to form an electrically conductive connection with the first electrode.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2A shows a cross-sectional view of a part of a circuit arrangement according to various embodiments, and FIG. 2B shows a cross-sectional view of a circuit arrangement according to various embodiments;

FIG. 4 shows a diagram illustrating a method of forming a circuit arrangement in accordance with various embodiments.

DESCRIPTION

Figure 1:
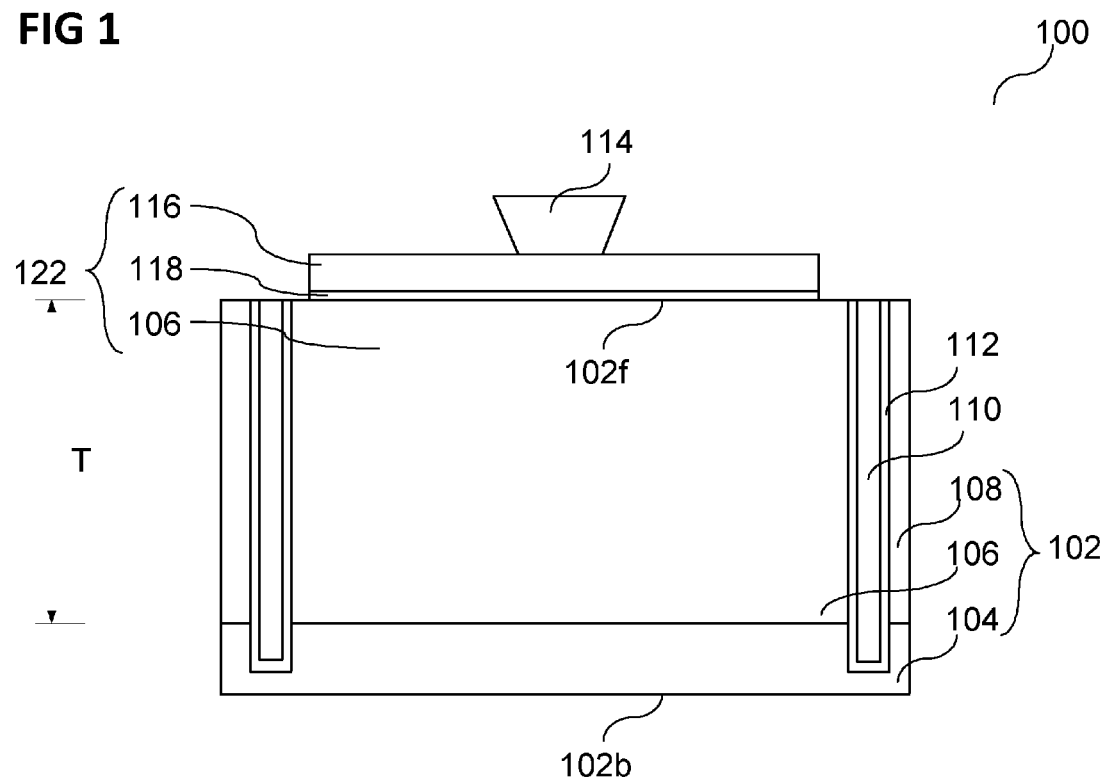
FIG. 1 shows a cross-sectional view of a part of a circuit arrangement according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

In a circuit arrangement, e.g. in an IC, capacitors, e.g. blocking capacitors, may be provided that have terminals, e.g. for a connection to a substrate of the circuit arrangement, with a low impedance and a low inductivity. In addition, insulated capacitors with a high capacitance may be required for various different tasks. The circuit arrangement may for example be provided in mobile communication devices, e.g. for pre-amplifiers, GPS sensors and/or high frequency applications.

In various embodiments, in a circuit arrangement formed in a substrate, a capacitor may be provided. A (buried) bottom electrode may be electrically connected to a back side of the substrate by a conductive path formed within the substrate between the bottom electrode and the back side of the substrate. Thereby, the bottom electrode may be electrically connected with a low impedance and a low inductivity. Furthermore, the electrical connection from the back side of the substrate may save substrate area and may be formed without requiring additional processes over those used for forming other semiconductor devices of the circuit arrangement.

In various embodiments, a circuit arrangement including a substrate, e.g. a semiconductor substrate, may be provided. The circuit arrangement may include a capacitor formed on a front side, e.g. on a front surface of the substrate. The capacitor may be electrically connected to the substrate, for example to a back side, e.g. to a back surface of the substrate opposite the front side, e.g. the front surface of the substrate, by means of a connection with a low impedance and a low inductivity. The electrical connection may for example be provided between the capacitor, e.g. an electrode, e.g. a bottom electrode, of the capacitor, and the back side of the substrate.

In various embodiments, the back side of the substrate may be connected to ground. The bottom electrode of the capacitor electrically connected with the back side of the substrate may therefore not require an additional ground contact. In various embodiments, an impedance and an inductivity may be low, e.g. minimal.

In various embodiments, the capacitor may not require a contact area formed on the front side of the substrate for electrically contacting the bottom electrode. Thus an area of the substrate, e.g. of the front side of the substrate, covered by the capacitor may be reduced, i.e. substrate space, e.g. chip space, may be saved.

In various embodiments, a bottom electrode of the capacitor may be connected to the back side of the substrate by means of a doped region. The doped region may be formed in the semiconductor substrate between the bottom electrode of the capacitor and the back side of the substrate.

In various embodiments, a conductive region may be formed in the substrate, e.g. at a back side of the substrate, for example extending along the whole back side, e.g. the back surface, of the substrate. The conductive region may for example be formed by a highly doped region (also indicated by a superscript "++") of the semiconductor substrate, e.g. a region with a concentration of more than $10^{18}$ $cm^{-3}$ of impurity atoms, e.g. a region with a concentration of more than $10^{19}$ $cm^{-3}$ of impurity atoms. The conductive region, e.g. at the back side of the substrate, may for example be of a first conductivity type. The conductive region may, in various embodiments, be electrically connected to ground or to another reference potential, if desired or required.

In addition to the capacitor, the circuit arrangement may, in various embodiments, include one or more semiconductor devices. The additional semiconductor device may for example be monolithically integrated in the semiconductor substrate.

The semiconductor device may, in various embodiments, be a further capacitor, for example a capacitor without a direct electrically conductive connection to the back side of the substrate, e.g. to a ground connection provided by the back side of the substrate. The semiconductor device, e.g. the further capacitor, may be formed on the front side of the substrate. The further capacitor may for example be a MISCAP.

In various other embodiments, the additional semiconductor device may be any other semiconductor device, for example a transistor, e.g. a bipolar transistor. In various embodiments, the circuit arrangement may include a plurality of semiconductor devices in addition to the capacitor.

In other words, in various embodiments, a circuit arrangement including a capacitor with a low impedance and a low inductivity and at least one additional semiconductor device may be provided.

In various embodiments, the capacitor may be a first MISCAP, and the at least one additional semiconductor device may be a second MISCAP with different properties, e.g. different structural and/or electrical properties. In this case, the circuit arrangement may be referred to as a double MISCAP arrangement. By way of example, only the first MISCAP may be (directly) conductively connected to a back side of the substrate by means of a doped region of a first conductivity type extending between a bottom electrode of the MISCAP and the back side of the substrate, and the second MISCAP may have a bottom electrode with a doping of a second conductivity type.

In various embodiments, the circuit arrangement may be described with the first conductivity type corresponding to p-type and the second conductivity type corresponding to n-type. Alternatively, any of the embodiments described herein may also be realized with the first conductivity type corresponding to n-type and the second conductivity type corresponding to p-type. For a p-type doping (also referred to as p-doping), dopant atoms acting as electron acceptors for the semiconductor material they are introduced into may be used. By way of example, group three (III) atoms, e.g. boron, indium or aluminum atoms, may be used for a p-doping of a group four (e.g. silicon or germanium) substrate, and group five atoms (V), e.g. phosphor, arsenic or antimony, may be used for an n-doping of the group four substrate.

In various embodiments, the capacitor and the at least one additional semiconductor device may be formed in parallel during a processing of the semiconductor substrate for forming the circuit arrangement.

FIG. 1 shows a cross-sectional view of a part 100 of a circuit arrangement according to various embodiments.

In various embodiments, the part 100 of the circuit arrangement may include a substrate 102 with a front surface 102f, also referred to as the second surface 102f, and a back surface 102b, also referred to as the first surface 102b, opposite the front surface 102f. A side of the substrate 102 on which the front/second surface is located may be referred to as the front side or the second side of the substrate 102, and a side of the substrate 102 on which the back/first surface is located may be referred to as the back side or the first side of the substrate 102. The substrate 102 may, in various embodiments, include or essentially consist of at least one semiconductor material. The semiconductor may for example be one of a group including silicon, germanium, gallium arsenide, and indium phosphide.

In various embodiments, the substrate 102 may include a doped region 104, which may also be referred to as the first doped region 104, of a first conductivity type extending from the first surface 102b into the semiconductor substrate 102. The doped region 104 may be a conductive region 104. By way of example, a concentration of dopant atoms in the doped region 104 may be high, e.g. at least about $10^{18}$ $cm^{-3}$, e.g. at least about $10^{19}$ $cm^{-3}$, e.g. at least about $10^{20}$ $cm^{-3}$, such that the doped region 104 of the semiconductor 102 may be degenerate and thereby conductive. A resistivity of the doped region 104 may be in a range from about 10 mΩ cm to about 30 mΩ cm, e.g. about 20 mΩ cm. In various embodiments, the first conductivity type may be p-type, and the dopant atoms for achieving the high doping of the first conductivity type of the region 104 may be dopant atoms acting as acceptors for the semiconductor of the doped region 104. In a case of the semiconductor being silicon, the dopant atoms may for example be boron atoms.

In various embodiments, the doped region 104 may be formed by a wafer or by a part of a wafer. The doped region 104, for example in a case where the doped region 104 is a wafer or part of a wafer, may be formed with the high dopant concentration. In other words, the semiconductor forming the doped region 104 may be formed with the high dopant concentration. Alternatively, the doped region 104 may be formed as a semiconductor with a different concentration of dopant atoms or without dopant atoms, and may be highly doped later, for example by means of implantation and/or diffusion.

In various embodiments, a thickness of the doped region 104 may be in a range from about 50 μm to about 1 mm, e.g. from about 100 μm to about 500 μm, e.g. about 100 μm. For example in a case where the doped region 104 is a wafer or a part of a wafer, the thickness of the doped region 104 may correspond to a typical thickness of a wafer, e.g. 275 µm, 375 µm, 525 µm, 625 µm, 675 µm, 725 µm, 775 µm or 925 µm. Alternatively, the wafer may be thinned, for example to a thickness of about 100 µm.

In various embodiments, the doped region 104 may be connected to ground. In other words, an electrically conductive connection may be arranged between the doped region 104, e.g. the back surface of the substrate 102b, and ground.

In various embodiments, the substrate 102 may include a doped region 106 of a first conductivity type extending from the second surface 102f into the semiconductor substrate 102. The doped region 106 may be a conductive region 106. In various embodiments, a concentration of dopant atoms in the doped region 106 may be high, e.g. at least about $10^{18}$ $cm^{-3}$, e.g. at least about $10^{19}$ $cm^{-3}$, e.g. at least about $10^{20}$ $cm^{-3}$, such that the doped region 106 of the semiconductor 102 may be degenerated and thereby conductive. In various embodiments, a resistivity of the doped region 106 may be in a range from about 10 mΩ cm to about 40 mΩ cm, e.g. from about 20 mΩ cm to about 30 mΩ cm. In various embodiments, the concentration of the dopant atoms in the doped region 106 may be the same or approximately the same as in the doped region 104. Alternatively the concentrations of the dopant atoms may be different in the doped region 104 and in the doped region 106. In various embodiments, the dopant atoms for achieving the high doping of the first conductivity type of the region 106 may be the same as for the doping of the region 104, for example boron atoms. Alternatively, the dopant atoms for achieving the high doping of the first conductivity type of the region 106 may be different from the dopant atoms of the region 106.

In various embodiments, the doped region 104 of the first conductivity type may extend from the first surface 102b into the semiconductor substrate 102 to form an electrically conductive connection with the doped region 106. In other words, both the doped region 104 and the doped region 106 may extend from the respective surfaces on which they are formed into the substrate 102, where they may electrically (conductively) contact each other. In various embodiments, the doped region 104 and the doped region 106 may also physically contact each other within the substrate 102.

In various embodiments, the semiconductor substrate 102 may include a region 108 that may be arranged above the doped region 104 and adjacent to the doped region 106. The substrate 102 may have an essentially uniform thickness. In other words, a total thickness of the substrate 102 in an area where the doped region 106 may be arranged above the doped region 104 may be essentially the same as a total thickness of the substrate 102 in an area where the region 108 may be arranged above the doped region 104. The region 108 may, in various embodiments, have a concentration of dopant atoms in a range from about $10^{13}$ $cm^{-3}$ to about $10^{14}$ $cm^{-3}$, which may be referred to as a light doping and may be indicated by a "−"-superscript. The doping of the first conductivity type may, in various embodiments, be a p-doping (e.g. a $p^-$-doping). In various embodiments, the region 108 may be undoped.

In various embodiments, the doped region 106 (which at that point may not be doped yet) and the region 108 may be formed, for example epitaxially grown, in a common process. In other words, a semiconductor layer may be formed over the doped region 104, e.g. over the wafer. By means of selectively doping the semiconductor layer, e.g. by means of implantation or diffusion using one or more masks, which may in various embodiments be followed by an annealing process, the regions 106 and 108 may be formed in the semiconductor layer.

In various embodiments, the semiconductor layer may be formed in two or more individual processes, for example by a plurality of deposition processes (e.g. epitaxy) forming the semiconductor layer as a stack of sublayers, and possibly by doping one or more of the sublayers before forming the next sublayer (not shown here, but see e.g. FIG. 2A and FIG. 2B).

In various embodiments, the semiconductor layer may have a thickness T in a range from about 1 µm to about 20 µm, for example from about 5 µm to about 10 µm, e.g. around 7 µm.

In various embodiments, the part of the circuit arrangement 100 may include at least one capacitor 122.

In various embodiments, the at least one capacitor 122 may include a first electrode 106. The first electrode 106 may consist of the doped region 106 of the first conductivity type extending from the second surface 102f into the semiconductor substrate 102.

The at least one capacitor 122 may further include a dielectric layer 118. The dielectric layer 118 may be formed over the first electrode 106 extending from the second surface 102f away from the semiconductor substrate 102. In other words, the dielectric layer 118 may be formed on the front surface 102f of the semiconductor substrate 102 at least partially in an area in which the first electrode 106 may be formed, and the dielectric layer 118 may be formed such that it extends away from the substrate 102. The dielectric layer 118 may, in various embodiments, include or essentially consist of a dielectric material, e.g. any dielectric material that may be temperature stable with respect to temperatures that may be used for a further processing of the circuit arrangement. By way of example, the dielectric layer 118 may include an oxide and/or a nitride, e.g. silicon oxide and/or silicon nitride. The dielectric layer 118 may for example include or essentially consist of a layer stack 118, e.g. a layer stack 118 including or essentially consisting of an oxide-nitride-oxide layer stack, e.g. of silicon oxide-silicon nitride-silicon oxide.

In various embodiments, the dielectric layer 118, e.g. the layer stack 118, may be formed by means of deposition and/or oxidation.

In various embodiments, the dielectric layer 118 may have a thickness in a range from about 10 nm to about 100 nm, for example from about 20 nm to about 70 nm, for example around 50 nm.

In various embodiments, the at least one capacitor 122 may further include a second electrode 116. The second electrode 116 may be formed over the dielectric layer 118 opposite the first electrode 106. In other words, the second electrode 116 may be formed over the dielectric layer 118 in such a way that the first electrode 106 and the second electrode 116 may be separated by the dielectric layer 118. In various embodiments, the second electrode 116 may include or consist of a conductive material, e.g. a layer of a conductive material, for example a highly doped semiconductor, e.g. polysilicon, e.g. a layer or a stack of polysilicon layers (also referred to as split-polysilicon) for example with a concentration of dopant atoms in a range from about $10^{20}$ $cm^{-3}$ to about $10^{21}$ $cm^{-3}$. In various embodiments, a resistivity of the second electrode 116 may be in a range from about 10 Ω cm to about 70 Ω cm, e.g. from about 40 Ω cm to about 60 Ω cm, e.g. around 50 Ω cm. In a case where the second electrode 116 may be a doped semiconductor, the second electrode 116 may have the second conductivity type. The second conductivity type may, in various embodiments, be n-type. In case of a silicon substrate, the n-type doping may for example be achieved by means of a doping with arsenic atoms. In various embodiments, the conductive material may include or essentially consist of a metal, for example aluminum and/or copper.

In various embodiments, the second electrode 116 may be formed by means of a deposition process. The deposition process may in various embodiments be followed by an etch process for structuring the second electrode 116.

In various embodiments, a thickness of the second electrode may be in a range from about 100 nm to about 300 nm, for example from about 150 nm to about 250 nm, for example around 190 nm.

In various embodiments, the part 100 of the circuit arrangement may further include at least one dielectric structure 110, 112 that may be configured to electrically separate the capacitor 122 from laterally adjacent, e.g. conductive, structures.

In various embodiments, the at least one dielectric structure 110, 112 may be at least one trench 110, 122. In other words, the part 100 of the circuit arrangement may include at least one trench 110, 112. The at least one trench 110, 112 may extend essentially vertically in the substrate 102. The at least one trench 110, 112 may be arranged adjacent to one or more conductive regions, e.g. conductive regions of the capacitor 122, e.g. adjacent to at least part of the first electrode 106. The at least one trench 110, 112 may for example surround the one or more conductive regions, e.g. the first electrode 106 (as shown in FIG. 1) or at least part of the first electrode 106 laterally. In various embodiments, the trench 110, 112 may extend vertically along the one or more conductive regions, e.g. along region 106 and/or or along the region 108. The at least one trench 110, 112 may have a depth that is large enough such that the at least one trench 110, 112 may extend into the doped region 104 of the semiconductor substrate 102, e.g. from a second surface of the substrate 102. The technique of electrically insulating individual semiconductor devices of an integrated circuit may be referred to as trench isolation. In various embodiments, the at least one trench 110, 112 may have a depth of several hundred nanometers, and a width of the at least one trench 110, 112 may be smaller than its depth, hence the trench isolation may be referred to as deep trench isolation (DTI).

In various embodiments, the at least one trench 110, 112 may be formed by means of etching, for example anisotropic etching, e.g. by means of deep ion etching.

In various embodiments, the at least one trench 110, 112 may be at least partially filled with a dielectric 112. By way of example, walls of the at least one trench 110, 112 may be coated with a dielectric coating 112, e.g. with an oxide 112. In a case where the semiconductor substrate 102 is silicon, the dielectric coating 112 formed on the walls of the at least one trench 110, 112 may be silicon oxide. A thickness of the dielectric coating may be in a range from about 10 nm to about 50 nm, e.g. around 15 nm.

In various embodiments, a volume 110 of the at least one trench 110, 112 inside the dielectric coating 112 may be filled, for example by a semiconductor, e.g. silicon, e.g. polysilicon. In various embodiments, the volume 110 may be filled with a dielectric, for example by an oxide, for example by the same oxide that may form the dielectric coating 112.

Alternatively, the at least one dielectric structure 110, 112 may have any other shape and/or may be filled by any other material or combination of materials that may be suited for preventing an electrically conductive connection, e.g. for preventing a current leakage, across the at least one dielectric structure 110, 112 without compromising a functionality of the circuit arrangement (e.g. the filling material of the at least one dielectric structure 110, 112 may need to be temperature stable during further processing, may need to have a coefficient of thermal expansion (CTE) that is close enough to the CTE of the semiconductor substrate 102 to not cause excessive mechanical tension during temperature changes, and/or the like). In various embodiments, the at least one dielectric structure 110, 112, e.g. the at least one trench 110, 112, may be formed after the capacitor 122, e.g. in a case where the filling material of the at least one dielectric structure 110, 112 may be sensitive to temperatures reached during a further processing of the circuit arrangement. In various embodiments, the at least one dielectric structure 110, 112, e.g. the at least one trench 110, 112, may be formed at any other time during the forming of the circuit arrangement, for example before the forming of the capacitor.

In various embodiments, the at least one trench 110, 112 may have a width in a range from about 500 nm to about 2 µm, e.g. around 1 µm.

In various embodiments, the circuit arrangement may further include a contact 114. The contact 114 may form an electrically conductive contact to and with the second electrode 116 of the capacitor 112. The contact 114 may for example be formed on a surface of the second electrode facing away from the first electrode. The contact 114 may include or essentially consist of metal, for example tungsten.

In various embodiments, the part 100 of a circuit arrangement may include the capacitor 122 formed on the front surface 102f of the substrate 102, wherein the first electrode 106 of the capacitor 122 may be electrically connected to the back surface 102b of the substrate 102 by means of an electrically conductive path being formed in the substrate 102 between the front surface 102f and the back surface 102b of the substrate 102.

In various embodiments, the electrically conductive path may consist of the first electrode 106 and the doped region 104, which may be in physical and electrical contact with each other within the substrate 102.

In various embodiments, the electrical contact to the bottom electrode 106 of the capacitor 122 provided through the substrate 102 may render a contact area formed on the front surface 102f of the substrate 102 for electrically contacting the bottom electrode 106 unnecessary. Thus an area of the substrate 102, e.g. of the front surface 102f of the substrate 102, covered by the capacitor may be reduced, i.e. substrate space, e.g. chip space, may be saved.

In various embodiments, an even larger area may be saved, for example by arranging the capacitor 122 underneath regions of the front surface 102f of the circuit arrangement 100 in which other parts of the circuit arrangement 100, e.g. bond pads, e.g. under bond pads used for testing the circuit arrangement 100, may be formed. As shown in FIG. 3B, a repeated contacting of the bond pads would not have a negative impact on a reverse leakage current of the capacitor 122.

FIG. 2A shows a cross-sectional view of a part 200 of a circuit arrangement according to various embodiments, and FIG. 2B shows a cross-sectional view of a circuit arrangement 201 according to various embodiments.

In various embodiments, the part 200 of a circuit arrangement, e.g. of the circuit arrangement 201, may to a large extent be similar or identical to the part 100 of a circuit arrangement described in context with FIG. 1. A duplication of a description of identical or similar parts, parameters, processes etc. may therefore have been omitted.

In various embodiments, the circuit arrangement 201 may include the part 200, and additionally at least one semiconductor device 240. The at least one semiconductor device 240 may be monolithically integrated in the semiconductor substrate 102.

In various embodiments, the part 200 of the circuit arrangement may at least partially be formed in a common process with at least a part of the at least one semiconductor device 240.

As shown in FIG. 2B, the at least one semiconductor device 240 may, in various embodiments, be another capacitor 240. Herein, a capacitor may be regarded as a semiconductor device if it includes at least one semiconductor material, e.g. silicon, germanium or the like. The capacitor 240 forming the semiconductor device 240 may for example include at least one electrode including or consisting of at least one semiconductor material, e.g. doped silicon, doped germanium or the like, wherein a concentration of dopant atoms may be high enough to make the semiconductor material conductive.

In various embodiments, the at least one semiconductor device 240 may be different from a capacitor, e.g. a transistor, for example a bipolar transistor, a diode, etc. In various embodiments, the at least one semiconductor device 240 may include a plurality of semiconductor devices 240, e.g. a plurality of semiconductor devices 240 with the same functionality, e.g. a plurality of capacitors or a plurality of transistors, etc., and/or a plurality of semiconductor devices 240 with different functionalities, e.g. a capacitor and a transistor.

In various embodiments, the at least one semiconductor device 240 may be formed in the region 108 of the substrate 102. The forming of the at least one semiconductor device 240 in the region 108 may require that the region 108 is formed as a stack of a plurality of layers. Each layer of the plurality of layers of the region 108 may, after its respective formation, be treated as required, e.g. masked, doped, oxidized, and/or planarized, etc.

In various embodiments, for example as shown in FIG. 2B, the semiconductor region 108 of the circuit arrangement 201 may include a first region 108a, which may be formed, e.g. by means of deposition, to extend between the doped region 104 and a point A. The first region 108a may for example be formed from a semiconductor material used for forming the region 108 as described in context with FIG. 1. In the first region 108a, a doped region 108b may be formed, for example by means of implantation and/or diffusion. The doped region 108b may for example be a region of the second conductivity type. After the doping of the first region 108a, a second region 108c may be formed, e.g. by means of deposition, to extend between the regions 108a/108b and a height of the substrate 102 extending to point B. The second region 108c may for example be formed from a semiconductor material used for forming the region 108 as described in context with FIG. 1. The semiconductor material of the second region 108c may, in various embodiments, be the same material as the semiconductor material of the first region 108a. In other embodiments, a different semiconductor material may be used. In the second region 108c, a doped region 108d may be formed, for example by means of implantation and/or diffusion. The doped region 108d may for example be a region of the second conductivity type. An irregular shape of the doped regions 108b and 108d as indicated in FIG. 2B may be caused by an annealing process conducted after the doping (either conducted after each doping process, or after several doping processes have been conducted, e.g. both of the doping process forming the doped region 108b and the doping process forming the doped region 108d), which may lead to a diffusion of dopant atoms from original positions after the doping deeper into the substrate. After the doping of the region 108c, a third region 108e, 108f, 108g may be formed, e.g. by means of deposition, to extend between the regions 108c/108d and a height corresponding to point C. The third region 108e, 108f, 108g may be formed with a thickness in a range from about 100 nm to about 300 nm, e.g. from about 150 nm to about 250 nm, e.g. about 190 nm. The semiconductor material of the third region 108e, 108f, 108g may, in various embodiments, be the same material as the semiconductor material of the first region 108a. In other embodiments, a different semiconductor material may be used. In the third region 108c, 108d, 108f, a plurality of conductive regions 108e, 108f may be formed, for example by means of implantation and/or diffusion. The doped regions 108e and 108f may for example be regions of the second conductivity type. Within the third region 108e, 108f, 108g, at least one dielectric region 108g may be formed. The at least one dielectric region 108g may be electrically separating the conductive regions 108e and 108f from each other and/or from adjacent regions in the third region 108e, 108f, 108g. The at least one dielectric region 108g may for example be formed by means of oxidation, for example by means of a shallow trench isolation process (also referred to as an STI-process). In this example, the region 108 may thus extend between the doped region 104 and point C, and it may include the regions 108a, 108b, 108c, 108d, 108e, 108f and 108g. Above the substrate region 108, further components of the at least one semiconductor device 240 may be arranged, e.g. a dielectric layer 226 may be arranged over the doped (conductive) region 108e. The dielectric layer 226 may be formed in a similar way and include a similar material or plurality of materials as the dielectric layer 118 of the capacitor 122 described in context with FIG. 1. Over the dielectric layer 226, a conductive layer 224 may be arranged. The conductive layer 224 may be formed in a similar way and include a similar material or plurality of materials and have similar properties as the second electrode 116 of the capacitor 122 described in context with FIG. 1. The region 108e may form a first electrode 108e of the at least one semiconductor device 240, and the conductive layer 224 may form a second electrode 224 of the at least one semiconductor device 240, which may be a capacitor in which the two electrodes 108e, 224 may be separated by the dielectric layer 226. An electrically conductive contact to the second electrode 224 of the at least one semiconductor device 240 may be provided by means of the contact 238, and an electrically conductive contact to the first electrode 108e of the at least one semiconductor device 240, which may be buried underneath the second electrode 224 of the at least one semiconductor device 240 and underneath the dielectric layer 226, may be formed by means of the conductive regions 108d, 108b and 108f and the contact 228. The contact 228 may be formed in a similar way and include a similar material or plurality of materials as the contact 114 described in context with FIG. 1.

In various embodiments, the at least one semiconductor device 240 may thus include the capacitor 240, wherein the capacitor 240 may not have an electrically conductive connection to the doped region 104 (at least not a direct connection—they may, however, be electrically connected by means of further structures (not shown) of the circuit arrangement 201 they are formed in). The capacitor 240 may be formed with the conductivity types reversed as compared with the capacitor 122.

In other words, in the circuit arrangement 201, in various embodiments, the at least one further semiconductor device 240 may be or include a second capacitor 240. The second capacitor may include a first electrode 108e including a doped region 108e of a second conductivity type forming at least part of the second surface 102f (the front surface 102f) of the substrate 102. In various embodiments, a dielectric 226 may be formed over the first electrode 108e of the second capacitor 240, and a second electrode 224 may be formed over the dielectric 226 of the second capacitor 240. In various embodiments, the semiconductor device 240 may further include an electrical contact 228 formed over the second surface 102f and electrically connected to the first electrode 108e of the second capacitor 240. The electrical contact 228 may be electrically connected to the first electrode 108e of the second capacitor by means of a doped region 108f and a doped region 108b/108d. The doped region 108f may for example form part of the front surface 102f of the substrate 102, e.g. in a region where the electrical contact 228 is formed over, e.g. on, the surface 102f of the substrate 102. In various embodiments, the doped region 108b/108d may be formed to electrically, e.g. electrically and physically, contact the doped region 108f. The doped region 108b/108d may further be formed to electrically, e.g. electrically and physically, contact the doped region 108e. In other words, by means of doped regions in the substrate, 102 e.g. doped regions of a second conductivity type, e.g. the doped regions 108b, 108d and 108f, an electrical connection to the first electrode 108 of the further capacitor 240 may be formed. A contact region for electrically contacting the first electrode 108e, which may be buried underneath the dielectric 226 and/or underneath the second electrode 224 of the further capacitor 240, from outside the substrate 102 may be formed on the front surface 102f of the substrate 102, e.g. adjacent to the second electrode 224, e.g. separated from the second electrode 224 by the dielectric region 108g.

In various embodiments, the part 200 of the circuit arrangement 201 may at least partially be formed in at least one common process with the at least one semiconductor device 240. By way of example, a substrate region 104b/106b of the part 200 may be formed in a common process with the region 108a of the semiconductor device 201, wherein both, the substrate region 104b/106b and the region 108a, may be formed up to point A. For example, the region 108a and the substrate region 104b/106b may be formed as a layer, e.g. as a continuous layer.

In various embodiments, after the, e.g. common, formation of the substrate region 104b/106b and the region 108a, the substrate region 104b/106b may be doped, for example with a high concentration of dopant atoms. The region 104b/106b may be doped to form a conductive region, for example a conductive region of the first conductivity type. For example, the concentration of dopant atoms may be similar to those of the doped region 104 and/or to the doped region 106 as described in context with FIG. 1. In various embodiments, a resistivity of the region 104b/106b may be in a range from about 10 mΩ cm to about 40 mΩ cm, e.g. from about 20 mΩ cm to about 30 mΩ cm. Depending on properties of the substrate region 104b/106b, e.g. on the semiconductor material used for the substrate region 104b/106b, a type of dopant atoms and/or the concentration of the dopant atoms, etc., the substrate region 104b/106b may appear as a part of the doped region 104 and/or as a part of the doped region 106, or as a separate substrate region.

Irrespective of those properties, in various embodiments, a conductive path may be formed in the part 200 of the circuit arrangement 201 between the front surface 102f and the back surface 102b of the substrate 102. In other words, the front surface 102f of the substrate 102, which may also form a front surface of the first electrode 106 of the capacitor 122, may be electrically connected to the back surface 102b of the semiconductor substrate 102, for example by means of the electrically conductive (doped) regions 106d, 106c, 104b/106b and 104. The electrically conductive regions between the front surface of the substrate 102f and the back surface 102b may for example form one continuous region with uniform or essentially uniform properties, e.g. the semiconductor material, dopant atoms and the concentration of the dopant atoms, may be the same or essentially the same along the conductive path between the front surface 102f and the back surface 102b of the semiconductor substrate 102, e.g. along the conductive path formed by the doped regions 106, 104b/106b and 104. The continuous region with the uniform properties may be formed in one process, or it may be formed in several processes, e.g. as several individual layers (some of which may be formed in common with regions, of the semiconductor device 240), which may be formed and processed (e.g. doped, tempered) in such a way that a continuous region with uniform properties is formed.

In various embodiments, properties of the individual region, e.g. layers, of the part 200 of the circuit arrangement, formed between the front surface 102f of the substrate and the back surface 102b of the substrate, may differ. For example, the dopant concentrations of the dopant atoms may differ in the different regions, e.g. layers (as long as the doped regions in the layers forming the conductive path between the front surface 102f of the substrate and the back surface 102b of the substrate are conductive and of the same conductivity type), and/or the substrate material and/or the type of dopant atoms and the like may differ.

As a further example of at least partially forming the part 200 and the semiconductor device 240 in a common process, the region 106c of the part 200, e.g. the capacitor 200, may be formed in common with a region 108c of the semiconductor device 201, e.g. as a common layer. After the common forming of the region 106c and the region 108c, e.g. as a common layer, both regions may, e.g. sequentially, be processed, e.g. by doping, tempering, and the like. Other regions of the part 200 and regions of the semiconductor device 240 may, in various embodiments, be formed in common, e.g. in a common process. In various embodiments, after a common formation of the at least one region of the part 200 and the at least one part of the semiconductor device 201, at least one of the part 200 and the semiconductor device 201 may be processed. In various embodiments, only the last-formed (e.g. formed last in common) region, e.g. layer, may be processed, e.g. doped, annealed, oxidized, and/or the like. In various other embodiments, the processing may act on more than the last-formed region, e.g. also on regions below the last-formed region. For example, in FIG. 2B. The region 104b/106b and the region 108a, both extending to point A, may first be formed, e.g. in common, on the doped region 104. The regions 106b and 108b may, in various embodiments, be processed, e.g. doped. Thereafter, in various embodiments, a layer including the regions 106c, 108c and 108d may be formed, e.g. in common, on the regions 104b/106b and 108a, for example extending up to a point B. Thereafter (and after an optional masking process), at least one process may be conducted, which may act on the last-formed layer only, or additionally on other layers of the circuit arrangement 201. By way of example, regions of the last-formed layer may be doped, and an annealing may be performed that may act on all the layers present in the circuit arrangement 201.

In various embodiments, the dielectric 118 of the capacitor 122 and/or the second electrode 116 of the capacitor 122 may be formed in common with one or more structures of the at least one semiconductor device 240. For example, the dielectric 118 may be formed in common, e.g. in a common process, with the dielectric 226 of the semiconductor device 240, e.g. of the capacitor 240, and/or the second electrode 116 of the capacitor 122 may be formed in common, e.g. in a common process, with the conductive layer 224 of the semiconductor device 240, e.g. with the second electrode 224 of the capacitor 240.

In various embodiments, the common formation of at least some of the structures may have an effect that additional processes and/or additional mask layers may be required as compared to a formation of the semiconductor device 240, no. For example, a modification of one or more masks used for a structuring of regions/layers of the circuit arrangement may be sufficient for additionally forming the capacitor 122 in the circuit arrangement 201.

In various embodiments, the at least one dielectric structure 110, 112 may be formed in the circuit arrangement 201. The at least one dielectric structure 110, 112 may, as described above, be formed adjacent to an electrically conductive structure, e.g. adjacent to at least one of the electrically conductive regions, e.g. the doped regions, 104$b$/106$b$, 106$c$ and 106$d$. The at least one dielectric structure 110, 112 may for example be formed surrounding at least one of the electrically conductive regions, e.g. the doped regions, 104$b$/106$b$, 106$c$ and 106$d$. The at least one dielectric structure 110, 112 may be formed between the part of the circuit arrangement 200 and the semiconductor device 240. The at least one dielectric structure 110, 112 may be formed to insulate the part of the circuit arrangement 200, e.g. the capacitor 122 formed in the part of the circuit arrangement 200, from the semiconductor device 240.

In various embodiments, the dielectric structure 110, 112 may be formed last, e.g. after at least all the layers forming the substrate 102, e.g. extending from the back surface 102$b$ of the substrate 102 to the front surface 102$f$ of the substrate 102, have been formed, possibly also after a final layer, e.g. the layer on which the dielectric 118 may be formed, e.g. the layer including the regions 106$d$, 108$f$, 108$e$, and 108$c$, may have been at least partially processed, e.g. doped, annealed, and/or polished, etc. In that case, the at least one dielectric structure 110, 112 may extend from the front surface 102$f$ of the semiconductor into the substrate 102, e.g. as shown in FIG. 1 and described in that context.

In various embodiments, the at least one dielectric structure 110, 112 may not be formed last, but may be formed before all the layers of the substrate 102 are formed, e.g. before a formation of the layer including the regions 106$d$, 108$f$, 108$e$, and 108$g$. In that case, the at least one dielectric structure 110, 112 may not extend to the front surface 102$f$ of the substrate 102. Instead, the at least one dielectric structure 110, 112 may extend only to a height in the substrate 102 that may correspond to a height of a surface of the substrate 102 at a time of forming the at least one dielectric structure 110, 112, e.g. a height corresponding to point B. Between the at least one dielectric structure 110, 112 and the front surface 102$f$ of the substrate 102, at least one further dielectric region 108$f$ may be formed, e.g. by oxidation. The at least one further dielectric region 108$f$ may include or consist of any suitable dielectric material, e.g. at least one dielectric material of a group of dielectric materials consisting of an oxide, a nitride, and a polymer. The further dielectric region 108$f$ may fulfill a similar or the same function as the at least one dielectric structure 110, 112, e.g. it may electrically insulate at least one conductive region of the part 200 of the circuit arrangement 201, e.g. a part of the capacitor 122, e.g. at least part of the first electrode 106, e.g. the doped region 106$d$, from adjacent, e.g. conductive, regions of the circuit arrangement 201, e.g. from the doped region 108$e$ of the semiconductor device 240.

Figure 3A:
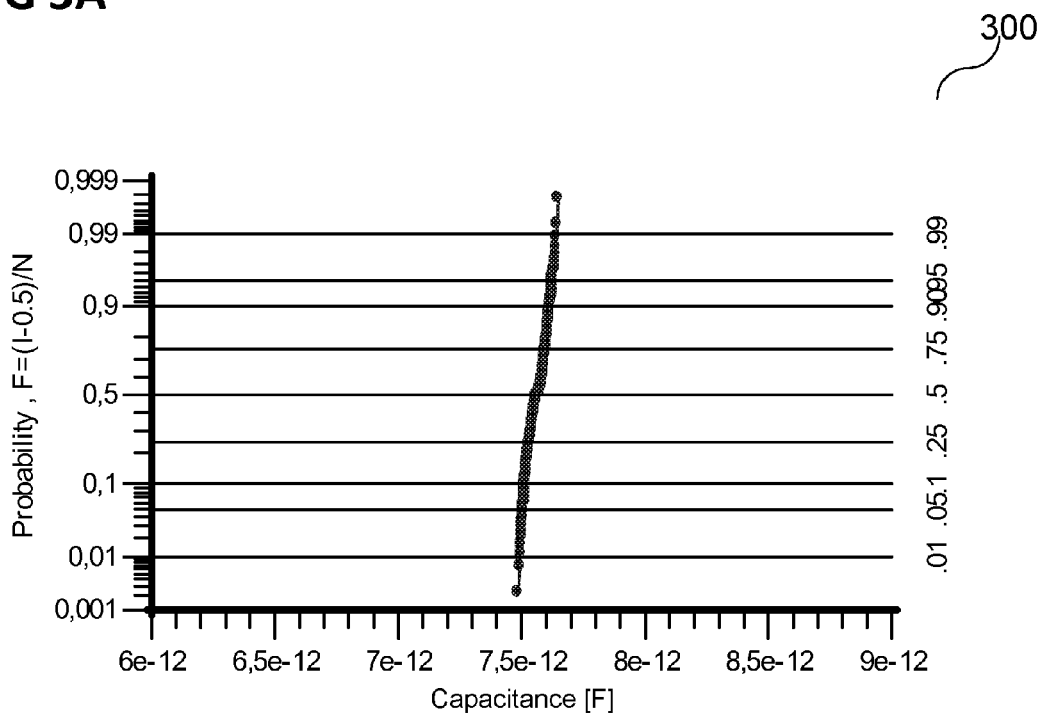
FIGS. 3A and 3B show graphical illustrations of experimental results for a capacitor of a circuit arrangement according to various embodiments.
Figure 3B:
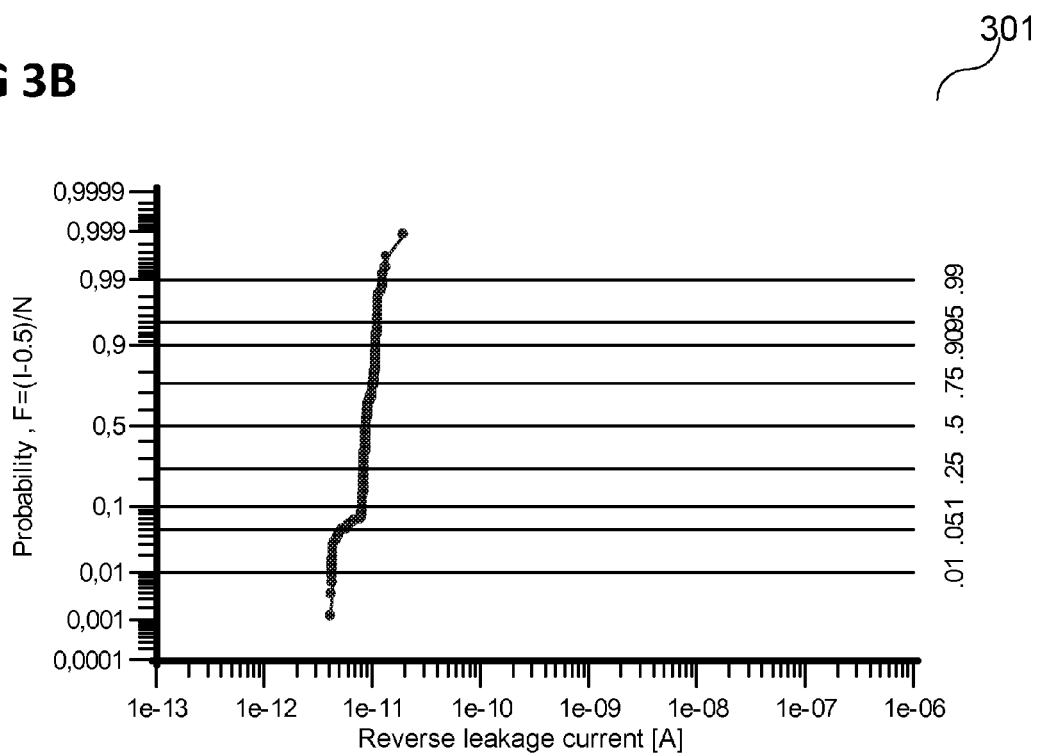

FIG. 3A and FIG. 3B show graphical illustrations 300, 301 of experimental results for a capacitor of a circuit arrangement according to various embodiments. The capacitor may correspond to any of the capacitors 122 described in context with embodiments of FIG. 1, FIG. 2A and FIG. 2B.

FIG. 3A shows in a plot 300 a probability distribution of capacitances measured for a plurality of experimental capacitors. The plot 300 may be used as an indicator for a capability of a process of forming the capacitor 122 of the circuit arrangement according to desired specifications for the capacitance. In the plot 300, the capacitance is drawn along the x-axis, and a probability is drawn along the y-axis.

From FIG. 3A, it may be concluded, from a straight line arrangement of data points for a capacitor formed with one set of parameters (which corresponds to a desired Gaussian distribution of capacitance) that a forming of capacitors with desired properties may be accomplished by choosing a suitable set of processing parameters.

In FIG. 3B, the probability is shown as a function of reverse leakage current for the experimental capacitor of FIG. 3A. The leakage current may have been measured after a repeated contacting of the capacitor, e.g. after repeated contacting of the contact 114, e.g. of a contact pad 114, or of a bond pad under which the capacitor may be arranged. As indicated by an almost straight line in which the data points are arranged in the plot, it may be concluded that a desired Gaussian distribution of a reverse leakage current may be achieved. Furthermore, an absolute value of the reverse leakage current of about $10^{-11}$ A may be considered low, and the reverse leakage current may remain low even after repeated contacting of the contact 114 or a contact pad, which may be arranged vertically over the capacitor.

FIG. 4 shows a diagram 400 illustrating a method of forming a circuit arrangement in accordance with various embodiments.

The method of forming a circuit arrangement may include forming, in a semiconductor substrate, a doped region of a first conductivity type extending from a first surface of the semiconductor substrate to an opposite second surface of the semiconductor substrate (in 4010).

The method may further include forming a dielectric layer on the second surface over the doped region of the first conductivity type (in 4020); forming a conductive region over the dielectric layer (in 4030); and forming at least one semiconductor device monolithically integrated in the semiconductor substrate (in 4040).

During the forming of the circuit arrangement according to various embodiments, at least one of the doped region, the dielectric layer and the conductive region may be formed in a common process with a part of the semiconductor device.

In various embodiments, the forming of the doped region of the first conductivity type may include a doping with boron. The forming of the doped region may include ion implantation.

In various embodiments, the forming of the conductive region may include forming a second doped region.

In various embodiments, the forming of the doped region of the second conductivity type may include a doping with arsenic. The forming of the doped region may include ion implantation.

In various embodiments, a circuit arrangement may be provided. The circuit arrangement may include a semiconductor substrate including a first surface, a second surface opposite the first surface, and a first doped region of a first conductivity type extending from the first surface into the semiconductor substrate. The circuit arrangement may further include at least one capacitor including a first electrode including a doped region of the first conductivity type extending from the second surface into the semiconductor substrate, a dielectric layer formed over the first electrode extending from the second surface away from the semiconductor substrate, and a second electrode formed over the dielectric layer opposite the first electrode. The circuit arrangement may further include at least one semiconductor device monolithically integrated in the semiconductor substrate. The first doped region of the first conductivity type may extend from the first surface into the semiconductor substrate to form an electrically conductive connection with the first electrode.

In various embodiments, the second electrode may include a highly doped region of a second conductivity type.

In various embodiments, the second electrode may include metal.

In various embodiments, the doped region of the first conductivity type may be electrically connected to ground.

In various embodiments, the first conductivity type may be p-type.

In various embodiments, the doped regions may include a concentration of dopant atoms of above $10^{19}$ cm$^{-3}$.

In various embodiments, the dopant atoms in the doped regions of the first conductivity type may include boron.

In various embodiments, the at least one semiconductor device may be one of a group consisting of a transistor, a diode, and a capacitor.

In various embodiments, the at least one further semiconductor device may be a second capacitor, including a first electrode including a doped region of the second conductivity type forming at least part of the second surface, a dielectric formed over the first electrode of the second capacitor, a second electrode formed over the dielectric of the second capacitor, and an electrical contact formed over the second surface and electrically connected to the first electrode of the second capacitor.

In various embodiments, a method of forming a circuit arrangement may be provided. The method may include forming, in a semiconductor substrate, a doped region of a first conductivity type extending from a first surface of the semiconductor substrate to an opposite second surface of the semiconductor substrate. The method may further include forming a dielectric layer on the second surface over the doped region of the first conductivity type, forming a conductive region over the dielectric layer, and forming at least one semiconductor device monolithically integrated in the semiconductor substrate.

In various embodiments, at least one of the doped region, the dielectric layer and the conductive region may be formed in a common process with a part of the further semiconductor device.

In various embodiments, the forming of the doped region of the first conductivity type may include a doping with boron.

In various embodiments, the forming of the doped region may include ion implantation.

In various embodiments, the forming of the conductive region may include forming a second doped region.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

What is claimed is:

1. A circuit arrangement, comprising:
   a semiconductor substrate, comprising:
   a first surface;
   a second surface opposite the first surface; and
   a first doped region of a first conductivity type extending from the first surface into the semiconductor substrate;
   at least one capacitor, comprising:
   a first electrode comprising a doped region of the first conductivity type extending from the second surface into the semiconductor substrate;
   a dielectric layer formed over the first electrode extending from the second surface away from the semiconductor substrate; and
   a second electrode formed over the dielectric layer opposite the first electrode; and
   at least one semiconductor device monolithically integrated in the semiconductor substrate;
   wherein the first doped region of the first conductivity type extends from the first surface into the semiconductor substrate to form an electrically conductive connection with the first electrode;
   wherein the at least one further semiconductor device is a second capacitor, comprising:
   a first electrode comprising a doped region of a second conductivity type forming at least part of the second surface;
   a dielectric formed over the first electrode of the second capacitor;
   a second electrode formed over the dielectric of the second capacitor; and
   an electrical contact formed over the second surface and electrically connected to the first electrode of the second capacitor.

2. The circuit arrangement of claim 1,
wherein the second electrode comprises a doped region of a second conductivity type.

3. The circuit arrangement of claim 1,
wherein the second electrode comprises metal.

4. The circuit arrangement of claim 1,
wherein the first doped region of the first conductivity type is electrically connected to ground.

5. The circuit arrangement of claim 1,
wherein the first conductivity type is p-type.

6. The circuit arrangement of claim 1,
wherein the doped regions comprise a concentration of dopant atoms of above $10^{19}$ cm$^{-3}$.

7. The circuit arrangement of claim 1,
wherein the dopant atoms in the doped regions of the first conductivity type comprise boron.

* * * * *